United States Patent [19]
Dautartas et al.

[11] Patent Number: 5,935,451
[45] Date of Patent: Aug. 10, 1999

[54] FABRICATION OF ETCHED FEATURES

[75] Inventors: Mindaugas Fernand Dautartas, Alburtis, Pa.; Yiu-Huen Wong, Summit, N.J.

[73] Assignee: Lucent Technologies Inc., Murray Hill, N.J.

[21] Appl. No.: 08/806,229

[22] Filed: Feb. 24, 1997

[51] Int. Cl.⁶ .................................................. H01L 21/302
[52] U.S. Cl. ................................ 216/2; 216/24; 216/41; 216/60; 216/85
[58] Field of Search .................................. 216/2, 24, 41, 216/60, 85

[56] References Cited

U.S. PATENT DOCUMENTS

| | | | |
|---|---|---|---|
| 4,682,503 | 7/1987 | Higashi et al. | 73/755 |
| 5,149,673 | 9/1992 | MacDonald et al. | 437/192 |
| 5,464,509 | 11/1995 | Mlcak et al. | 204/129.3 |
| 5,526,454 | 6/1996 | Mayer | 385/49 |
| 5,683,546 | 11/1997 | Manaka | 156/643.1 |
| 5,700,382 | 12/1997 | Splett | 216/24 |
| 5,719,073 | 2/1998 | Shaw et al. | 473/228 |

FOREIGN PATENT DOCUMENTS

| | | |
|---|---|---|
| 635876 A1 | 1/1995 | European Pat. Off. . |
| 4332414 A1 | 3/1995 | Germany . |

OTHER PUBLICATIONS

Comerford, L.D. "Etched silicon structure for aligning a photodiode and optical fiber" IBM Tech. Discl. Bull. 22 (7) 2935–2936, Dec. 1979.

Patent No. EP0635876A, issued in EPO on Jan. 25, 1995 to Dautartas et al. Translation: no.

Patent No. DE4332414A1, issued in Germany on Mar. 30, 1995 to Schmidt–Sodingen et al. Translation: no. Comments: Translation will follow.

Patent No. 0418423A1, issued in EPO on Mar. 27, 1991 to Dietrich et al. Translation: no. Comments: Translation will follow.

*Primary Examiner*—R. Bruce Breneman
*Assistant Examiner*—Anita Alanko
*Attorney, Agent, or Firm*—Lester H. Birnbaum

[57] ABSTRACT

Disclosed is a method of fabricating electronic components on a semiconductor substrate by etching features in the substrate through a mask including apertures which are separated by a prescribed spacing. Etching is continued until the etched features merge into a single channel. This technique can be used to form channels having nonuniform shapes, or could be used to monitor the end point of an etching operation.

16 Claims, 5 Drawing Sheets

FABRICATION OF ETCHED FEATURES

FIELD OF THE INVENTION

This invention relates to the fabrication of etched features in a substrate.

BACKGROUND OF THE INVENTION

In many applications of electronic packages, it is desirable to provide features of non-uniform widths in a substrate. For example, U.S. patent application of Anigbo et al, Ser. No. 60/009116, filed Dec. 22, 1995, U.S. Pat. No. 5,881,193 which is incorporated by reference herein, describes an optical subassembly formed on a semiconductor substrate and including a laser and a photodiode mounted on the substrate. In order to more effectively couple the laser light to the photodiode, a channel is etched into the substrate, the channel being wider in the area under the photodiode than in the area under the laser.

While such a feature could be formed using two mask levels, it would be more economical to fabricate the feature with a single mask level while controlling the transition from the narrow end to the wider end of the channel.

Another problem which exists in etching substrates is the inability to quickly and easily determine the end point of an etching operation. It is, therefore, desirable to provide features which will give a clear visual indication when the etching operation should be terminated.

SUMMARY OF THE INVENTION

The invention is a method of fabricating an electronic component on a semiconductor substrate. In accordance with one aspect, a portion of the substrate is etched through a mask containing at least two apertures with a predetermined spacing therebetween, one aperture being relatively wider than the other aperture. The substrate is etched initially to form separate features under each aperture, and the etching is continued at least until the etched features merge into one channel having a relatively wider and narrower end.

In accordance with another aspect, a portion of the substrate is etched through a mask containing at least two apertures with a predetermined spacing therebetween, the substrate is etched initially to form separate features under each aperture, and the substrate is visually inspected until at least some of the etched features merge into a single channel at which time the etching is terminated.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
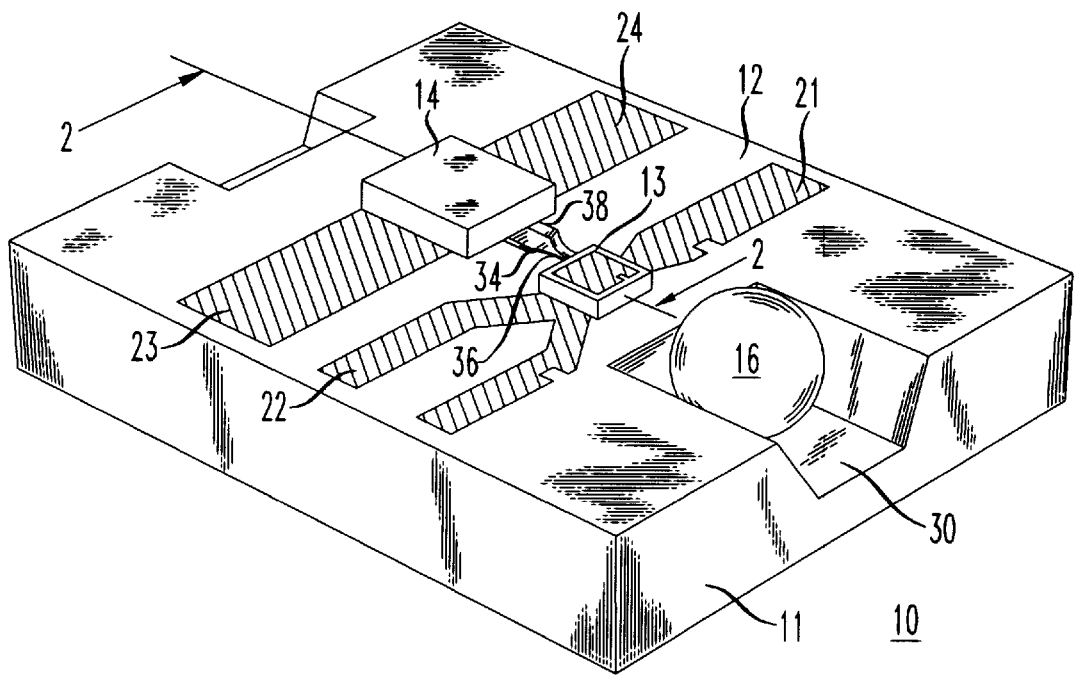
FIG. 1 is a perspective view of an optical subassembly which may be fabricated in accordance with the invention.
Figure 2:
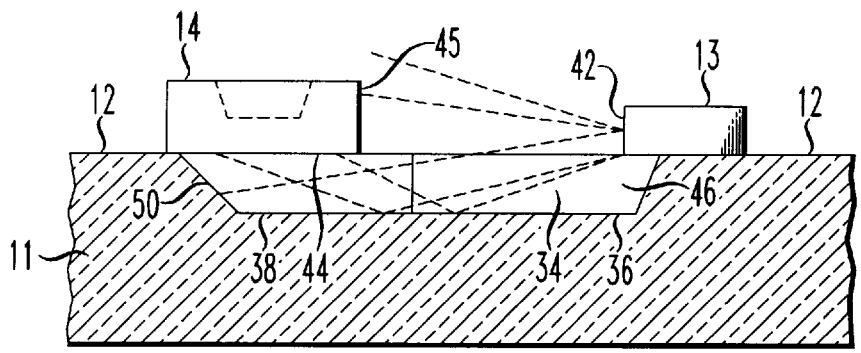
FIG. 2 is a cross sectional view taken along line 2—2 in FIG. 1.

Referring now to the drawings, in which like reference numerals identify similar or identical elements, FIGS. 1 and 2 illustrate a typical electronic component which may utilize the invention. In this example, the component, 10, is an optical subassembly which is described in more detail in the Application of Anigbo et al, cited previously. The subassembly comprises a semiconductor substrate, 11, which is typically silicon. The surface, 12, of the substrate lies in the 100 plane in this example. A laser, 13, and a photodiode, 14, are mounted on the surface, 12, with the photodiode aligned to receive light from the backface of the laser. A spherical lens, 16, is also mounted in a channel, 30, in the substrate, 11, and aligned with the laser to focus light received therefrom. Metallization, 21–24, is also included on the substrate surface to provide electrical contact to the laser and photodiode.

A channel, 34, is also formed in the semiconductor substrate between the laser, 13, and photodiode, 14. The channel, 34, includes a relatively narrow end, 36, proximate the laser, 13, and a relatively wider end, 38, proximate the photodiode, 14. Typically, the narrow end, 36, will have a width within the range 15 to 30 microns, while the wider end, 38, will have a width within the range 140 to 240 microns. The wider end, 38, will typically have a width which is at least twice as great as the narrow end.

The surfaces, 46, of the channel, 34, are coated with a reflective material such as aluminum or gold. As illustrated in FIG. 2, the laser, 13, and photodiode, 14, are mounted so as to overhang the channel, 34, and are aligned so that some light (illustrated by the dashed lines) from the backface, 42, of the laser is directly incident on light admitting facet, 45, of the photodiode and some light is reflected by the surfaces of the channel, 34, so as to be incident on light admitting facet, 44. End surface, 50, is also oriented to reflect a portion of the light to the light admitting facet, 44. The channel, 34, therefore, permits collection of a higher percentage of light from the laser than would be possible with a planar surface of the substrate.

Figure 3:
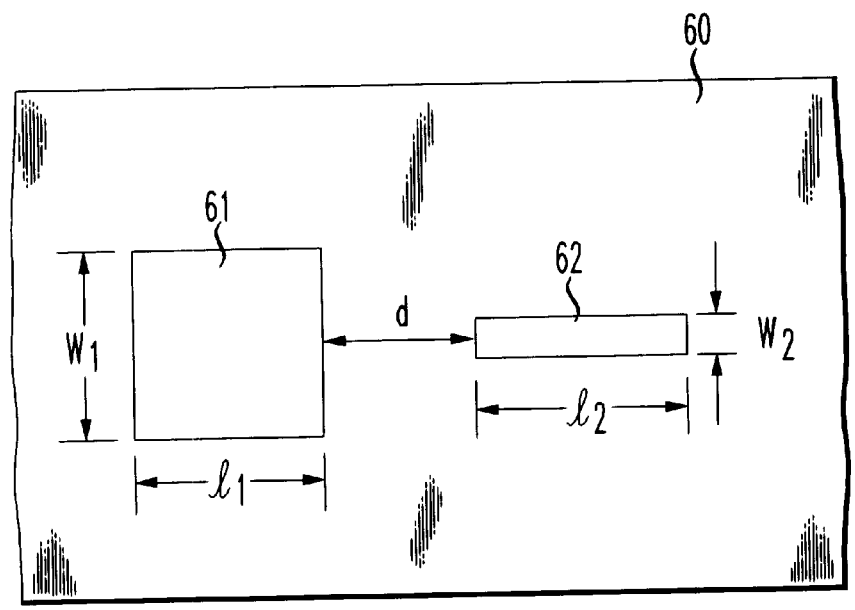
FIG. 3 is a plan view of a portion of a mask which may be utilized in accordance with an embodiment of the invention.

In order to fabricate the channel, 34, use is made of a mask illustrated in FIG. 3. The mask, 60, is typically made of a photoresist material which has been deposited on the surface of the substrate, 11, exposed through another mask (not shown) and developed according to standard photolithographic techniques. The developed mask includes two apertures, 61 and 62, which are separated by a predetermined distance, d. The lengths, $l_1$ and $l_2$, of the apertures, 61 and 62, in this example are 700 $\mu$m and 150 $\mu$m respectively. The width, $w_1$ of aperture 61, is slightly less than the desired width of the wide end, 38, of the channel, and the width, $w_2$, of the aperture, 62, is slightly less than the desired width of the narrow end, 36, of the channel. The distance, d, between the apertures is chosen to permit the features formed in the substrate by etching through the mask to merge and form a single channel, 34 of FIGS. 1 and 2 as described below. This distance, d, in this example was approximately 10 $\mu$m, but would vary depending upon the etchant. The distance is preferably at least 2 $\mu$m to ensure meeting tolerances in this example.

Figure 4:
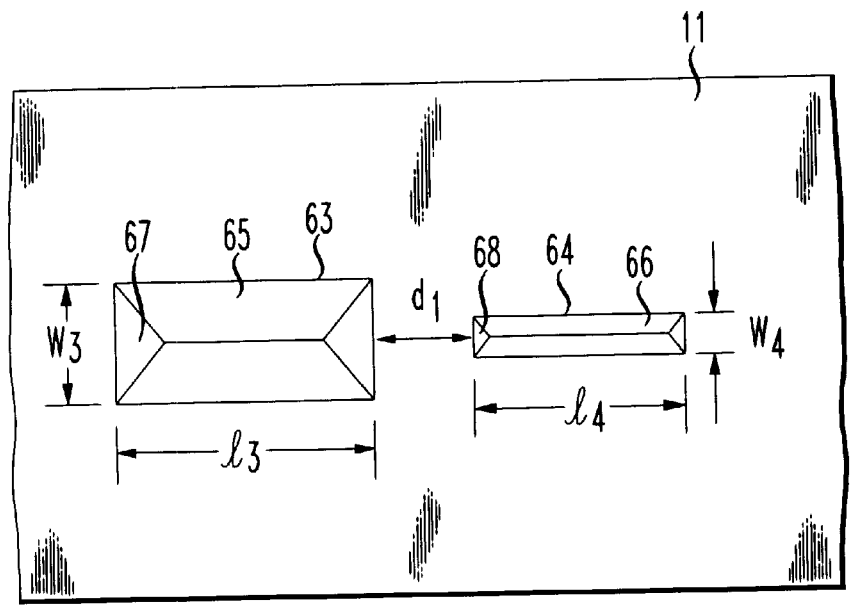
FIGS. 4–6 are plan views of a portion of the subassembly during different stages of fabrication in accordance with an embodiment of the invention.
Figure 7:
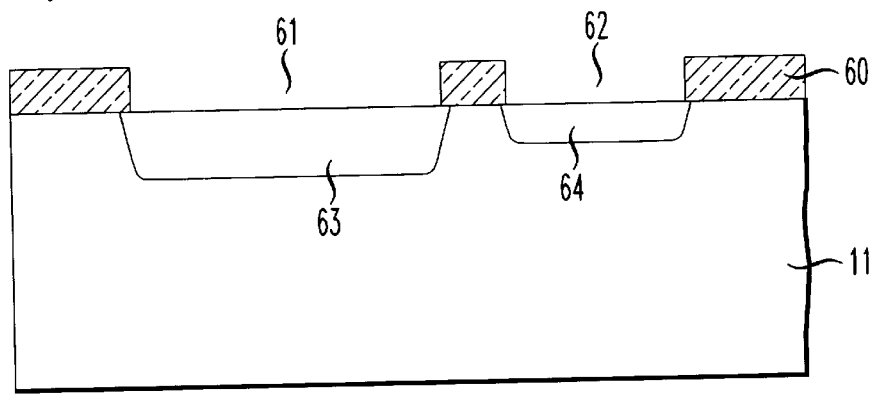
FIGS. 7–9 are cross sectional views of the subassembly during corresponding stages of fabrication in accordance with the same embodiment.

FIG. 4 shows a plan view of the substrate, 11 (with the mask, 60, removed for illustrative purposes), and FIG. 7 shows a cross sectional view of the substrate, both depicting an initial phase of the etching operation. A typical etchant employed is ethylene diamine pyrocatechol. Etched features, 63 and 64, are formed in the substrate under corresponding apertures, 61 and 62 in the mask. Due to the crystallographic nature of the silicon substrate, the sidewalls, e.g., 65 and 66, of the features, 63 and 64, will be formed along well—defined crystallographic planes. In this example, where etching is done on the 100 surface, the side walls will be in the 111 crystallographic planes. These planes form a V-shaped groove between the two end walls, e.g. 67 and 68, of the etched features, 63 and 64. The feature, 63, is deeper than the feature, 64, because the aperture 61 was wider than the aperture 62 in the mask 60. The widths, $w_3$ and $w_4$, of the features, 63 and 64, will be slightly larger than the widths, $w_1$ and $w_2$, of the corresponding apertures, 61 and 62, as the mask is undercut. The lengths, $l_3$ and $l_4$, of the features, 63 and 64 will also be slightly larger than the lengths, $l_1$ and $l_2$, of the corresponding apertures, 61 and 62, thereby producing a spacing, $d_1$ between the features which is less than the spacing, d, between the apertures.

Figure 5:
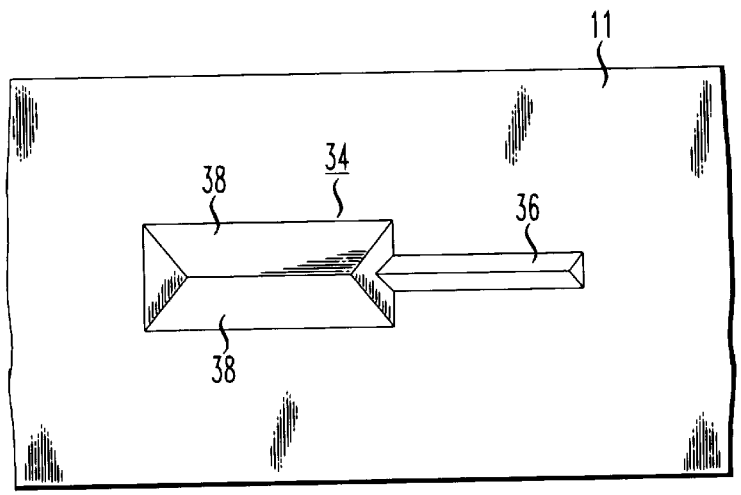
Figure 8:
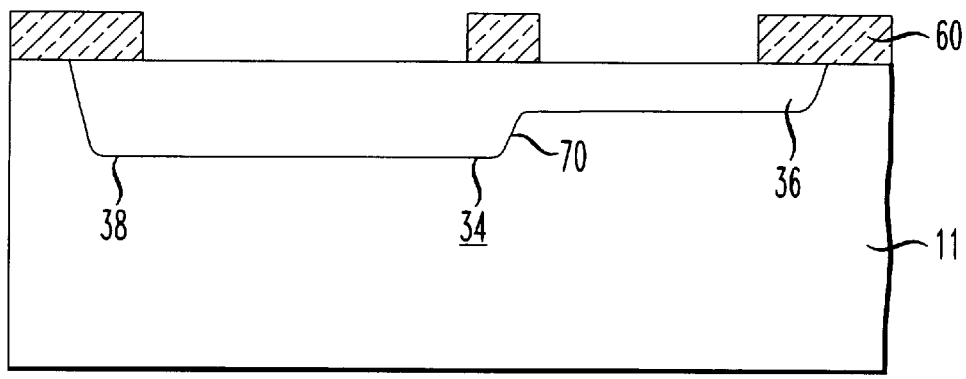

The etching is permitted to continue until the condition depicted in FIGS. 5 and 8 is achieved. It will be noted that the two features have merged in the longitudinal direction ($d_1 \rightarrow 0$) to form a single channel, 34, having a shallow, narrow end, 36, and a deeper, wider end, 38 with an abrupt transition from the narrow to wide end. The two ends are now connected by a sloping bottom surface, 70. In this particular example, using a EDP etchant, the desired state was achieved by etching for a period of 4.5 hours.

Figure 6:
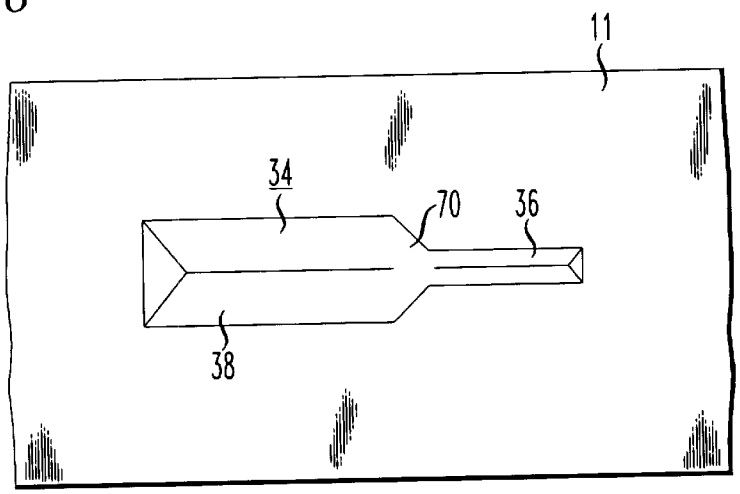
Figure 9:
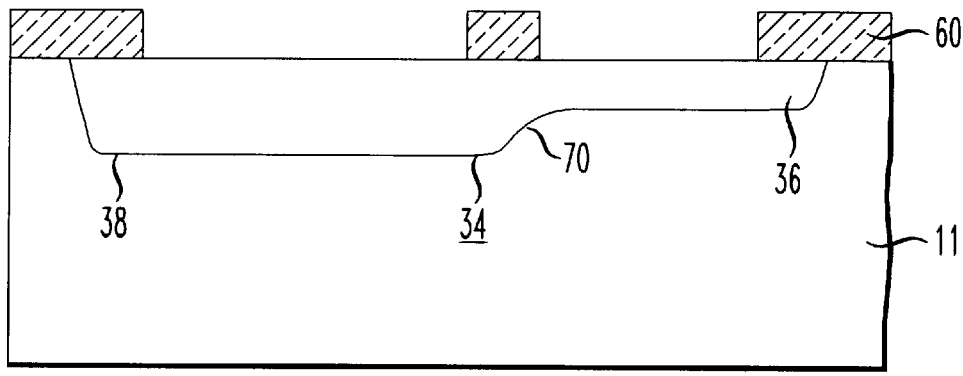

As etching is permitted to continue, the condition depicted in FIGS. 6 and 9 results. Here, the transition from wide end to narrow end is tapered, and the bottom surface 70 is more rounded. In this example, this is the desired end condition and etching is stopped. The etching time was approximately 5 hours. Suitable etching times using other etchants and other separations can be easily determined empirically.

Figure 10:
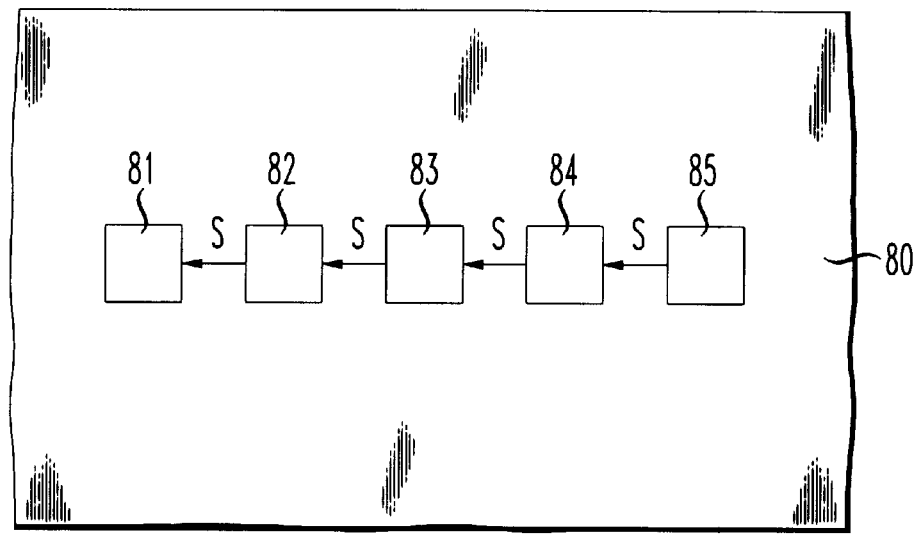
FIG. 10 is a plan view of a portion of a mask which may be utilized in accordance with another embodiment of the invention.
Figure 11:
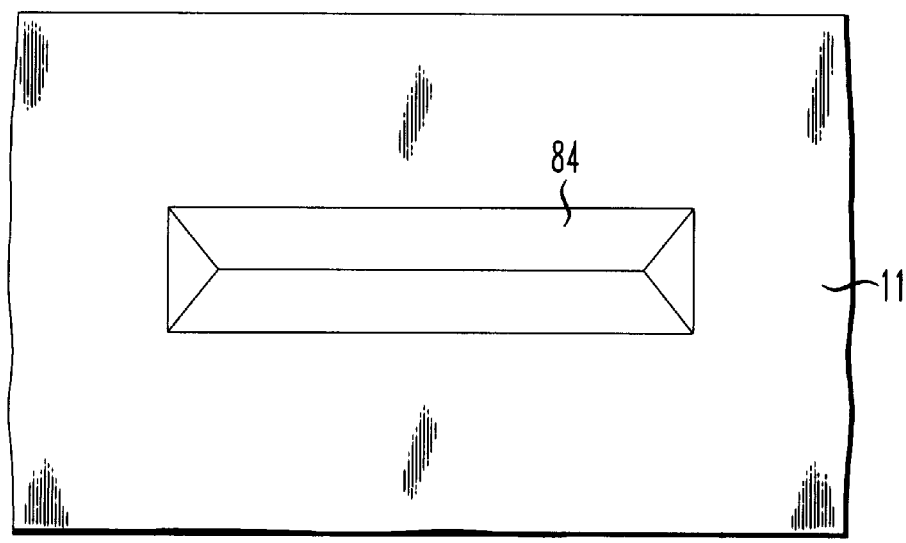
FIG. 11 is a plan view of a portion of a substrate during a certain stage of fabrication in accordance with the embodiment of FIG. 10.

In accordance with another embodiment of the invention, etching of a semiconductor substrate can be monitored by using etched features on selected portions of the substrate. For example, as illustrated in the plan view of FIG. 10, a row of apertures, 81–85, could be formed in a desired portion or portions of a photoresist mask, 80, formed over the substrate, 11 of FIG. 1. These apertures could also have a predetermined spacing, s, therebetween, which in this case is the same for all apertures, but could be varied. The spacing is determined empirically in accordance with the desired end point of the etching operation. Thus, during the etching operation, the operator could remove the substrate from the etching bath and visually inspect the amount of etching in the substrate below the apertures, 81–84 without magnification. Once the etched features have merged into a single channel, 84, of FIG. 11, the operator knows the end point has been reached without having to microscopically inspect the substrate.

Various modifications of the invention will become apparent to those skilled in the art. For example, although the apertures were shown as rectangular (square or rectangle), other shapes are possible.

The invention claimed is:

1. A method of fabricating an electronic component on a semiconductor substrate comprising the steps of:

etching a channel having relatively wider and narrower ends in the substrate with a single mask, said mask containing at least two apertures with a spacing therebetween, one aperture being relatively wider than the other, the etching initially forming separate etched features in the substrate under each aperture; and continuing the etching at least until the two etched features merge into one channel having relatively wider and narrower ends.

2. The method according to claim 1 wherein the substrate comprises silicon.

3. The method according to claim 2 wherein the silicon has a major surface lying in the 100 crystallographic plane.

4. The method according to claim 1 wherein the mask comprises a photoresist material.

5. The method according to claim 1 wherein the apertures are rectangular.

6. The method according to claim 1 wherein the component is an optical subassembly.

7. The method according to claim 1 wherein the wider end of the channel has a width which is at least twice as great as the narrower end.

8. The method according to claim 1 wherein a tapered transition region is formed between the relatively wider and narrower ends.

9. The method according to claim 8 wherein the transition region includes a sloped bottom surface.

10. A method of fabricating an electronic component on a semiconductor substrate comprising the steps of:

etching at least a portion of the substrate through a mask containing at least two apertures with a spacing therebetween to initially form separate etched features in the substrate under each aperture;

visually inspecting the etched features as the etching proceeds through said mask, and terminating the etching through said mask when at least the two features merge into a single channel.

11. The method according to claim 10 wherein the substrate is silicon having a major surface in the 100 crystallographic plane.

12. The method according to claim 10 wherein the mask comprises a photoresist material.

13. The method according to claim 10 wherein the apertures are rectangular.

14. The method according to claim 10 wherein the mask includes a row of such apertures.

15. The method according to claim 1 wherein the etching until the two etched features merge is done by a single etchant.

16. The method according to claim 10 wherein the etching until the two features merge is done by a single etchant.

* * * * *